United States Patent [19]

Minagawa et al.

[11] 4,456,847
[45] Jun. 26, 1984

[54] SURFACE ACOUSTIC WAVE DEVICE

[75] Inventors: Shoichi Minagawa; Takeshi Okamoto; Teruo Niitsuma, all of Tokyo, Japan

[73] Assignee: Clarion Company, Ltd., Tokyo, Japan

[21] Appl. No.: 499,930

[22] Filed: Jun. 1, 1983

[30] Foreign Application Priority Data

Jun. 7, 1982 [JP] Japan ................................. 57-96176

[51] Int. Cl.³ .............................................. H01L 41/08
[52] U.S. Cl. .................................. 310/313 R; 310/313 B
[58] Field of Search ............ 310/313 R, 313 B, 313 C, 310/313 D; 333/150, 151, 154, 193, 194

[56] References Cited

U.S. PATENT DOCUMENTS

| 3,401,360 | 9/1968 | Bois | 310/313 B |
|---|---|---|---|
| 3,723,919 | 3/1973 | Adler | 310/313 B |
| 3,938,062 | 2/1976 | Hopp | 333/154 |
| 3,955,160 | 5/1976 | Duffy | 310/313 B |
| 3,987,376 | 10/1976 | Kerbel | 333/154 |
| 4,037,176 | 7/1977 | Ono et al. | 310/313 B |
| 4,162,465 | 7/1979 | Hunsinger et al. | 310/313 B |
| 4,209,759 | 6/1980 | Volluet | 333/154 X |
| 4,354,130 | 10/1982 | Ono et al. | 333/154 X |

Primary Examiner—Mark O. Budd
Attorney, Agent, or Firm—Flynn, Thiel, Boutell & Tanis

[57] ABSTRACT

A surface acoustic wave device comprises a lower electrode provided on an elastic substrate, a piezoelectric film covering the lower electrode and an upper electrode provided on the piezoelectric film. The device is characterized in that the upper electrode comprises first and second double electrodes both opposed to the lower electrode.

11 Claims, 10 Drawing Figures

SURFACE ACOUSTIC WAVE DEVICE

BACKGROUND OF THE INVENTION

This invention relates to a surface acoustic wave device wherein mechanical reflection of a surface acoustic wave is reduced.

A surface acoustic wave device, which mainly consists of a piezoelectric substrate made of a piezoelectric single-crystal material such as crystal, a piezoelectric ceramic material or a combination of a non-piezoelectric plate and a piezoelectric film material deposited thereon, is arranged to convert an electric signal to a surface acoustic wave by a transducer provided on the piezoelectric substrate and to propagate the surface acoustic wave along the substrate surface. It is now employed as filters and other various electronic parts.

FIG. 1 shows a filter as an example of the electronic parts in which reference numeral 1 designates a piezoelectric substrate, 2 is an input tranducer comprising a pair of interdigitating comb-shaped electrodes 2A and 2B, and 3 is an output transducer comprising a pair of interdigitating comb-shaped electrodes 3A and 3B. An electric signal applied to an input terminal IN is converted to a surface acoustic wave by means of the input transducer 2 and travels along the surface of the piezoelectric substrate 1 as shown by the arrow in the Figure. When the surface acoustic wave reaches the output transducer 3, it is reconverted to an electric signal by the transducer 3 and is taken out from an output terminal OUT. The transducers 2 and 3 are so-called normalized type of electrodes with each electrode strip width W and each distance L between adjacent electrode strips of the electrodes 2A, 2B, 3A and 3B are $\lambda/4$ when wavelength of the center frequency $f_o$ of a surface acoustic wave is $\lambda$.

Since the filter including the transducers comprising the comb-shaped electrodes with the above-mentioned measurement cannot be free from multiple reflection i.e. TTE (triple transit echo) of a surface acoustic wave between the input and output transducers during their operations, the wave after passing through the filter is out of order in its phase (ripple is caused). This is undesirable for reception of FM signals, for example.

There are two factors of generating said TTE. One of the factors is mechanical reflection of a surface acoustic wave due to difference between an acoustic impedance in a zone where the comb-shaped electrodes are located and an acoustic impedance in a zone where the electrodes do not exist. The other factor is electric reflection due to bidirectional property of the transducers (a nature that the transducers are capable of transmitting or receiving surface acoustic waves symmetrically right and left). As to the electrical reflection, its influences can be reduced by causing on purpose mis-matching at the input and output of the transducers, or by changing the transducers to be unidirectional by a polyphase power supply method. As to the mechanical reflection, however, irrespective of the following various trials, satisfactory effects could not be obtained.

One of the trials is to design the comb-shaped electrodes 2A, 2B, 3A and 3B of the input and output transducers 2 and 3 by dividing each strip into two parts so that each divided electrode strip width W and distance L between the strips are $\lambda/8$, respectively, as shown in FIG. 2.

According to the structure, since the phases of the reflected waves at the respective electrode ends differ by 180° from each other, that is, they are opposite phases, the reflected waves mutually cancel each other, thereby certainly reducing undesired influences by the mechanical reflection.

However, the electrode strip width W and the distance L between the electrode strips must be $\lambda/8$, and higher the frequency, smaller the $\lambda$ becomes. Therefore, extremely high accuracy is required upon making the electrodes by photolithographic method, thereby leading to lower productivity in manufacturing of the device.

Further, since the distance between the electrode strips is extremely small, short circuit between the electrodes easily occurs due to dust or other particles, thereby causing mis-operation of the device.

Another trial is to employ a structure of the piezoelectric substrate 1 comprising an elastic material plate 4 and a piezoelectric film 5 covering the plate 4 as shown in FIGS. 3(a) and 3(b). A sheet-like lower electrode 6 to serve as one of the above-mentioned comb-shaped electrodes is provided between the plate 4 and the piezoelectric film 5 whereas upper electrodes 7A and 7B to serve as the other of the electrodes are provided on the piezoelectric film 5 so that they are opposed to the lower electrode 6 and that the electrode strip width W and the distance L between the respective electrode strips are $\lambda/2$, respectively. Thereby, a single phase transducer is constructed.

This structure of the transducer is different from a normalized electrode and includes only one comb-shaped electrode 7A or 7B so that a signal source 8 is connected between the upper electrode 7A and the lower electrode 6 to take out an electric signal at a load 9 between the upper electrode 7B and the lower electrode 6. Therefore, bad influences to the electrodes by dust or other particles are prevented and accuracy for making the electrodes may be lower than the former case, thereby improving productivity in manufacturing of the device.

However, since this structure makes it impossible to drive the device by the so-called balanced power supply by supplying the upper electrode 7A with signals having two polar (positive and negative) electric potentials with respect to the potential (earth potential) of the lower electrode 6, electromagnetic coupling (feedthrough) between the input and output transducers, wherein the electric signal is not converted to a surface acoustic wave and is propagated as a direct wave from the input to the output, becomes large. As the result, the direct wave and the necessary surface acoustic wave concurrently exist, thereby worsening filtering effect.

A still further improvement is to design a so-called balanced-type single phase transducer wherein further upper electrodes 8A and 8B are opposed to the upper electrodes 7A and 7B at $\lambda/2$ phase difference and via the space a as shown in FIG. 4, in order to enable the balanced power supply in the structure of FIG. 3.

This structure certainly enables reduction of feedthrough by supplying signals at 180° phase difference between the upper electrodes 7A and 7B from a power source 8.

However, since this structure requires the space a between the both electrodes for prevention of short circuit, surface acoustic waves $S_1$ and $S_2$ which must have a same phase as a result of excitation by the electrodes come to disorder in their waveforms due to existence of the space a which does not generate a surface acoustic wave.

OBJECT OF THE INVENTION

It is therefore an object of the present invention to provide a surface acoustic wave device wherein mechanical reflection is removed.

SUMMARY OF THE INVENTION

According to the invention, an upper electrode opposed to a lower electrode via a piezoelectric film is composed of first double electrode and second double electrode.

DETAILED DESCRIPTION OF THE PREFERRED EMBODIMENTS

Figure 1:
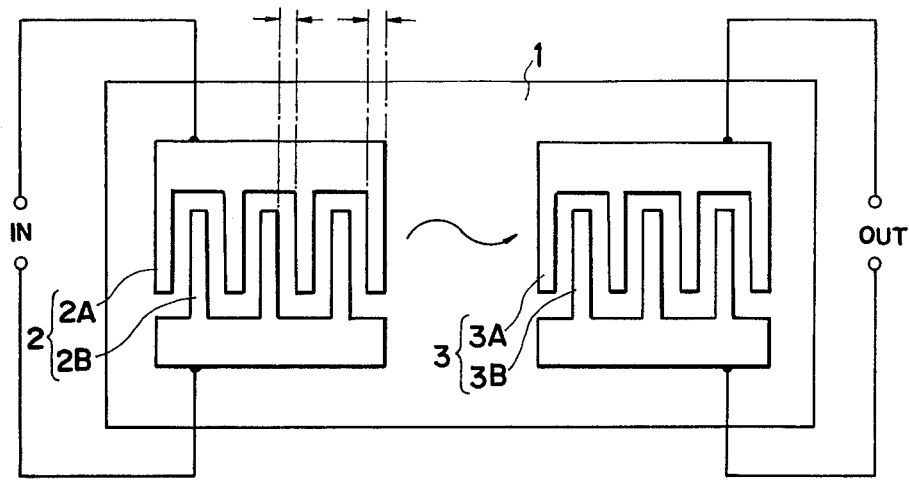
FIGS. 1, 2, 3(a) and 4 are upper views of conventional surface acoustic wave devices.
Figure 2:
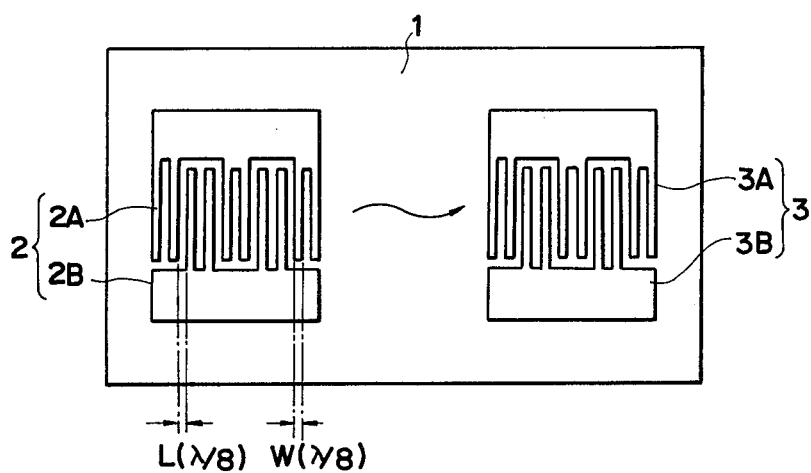
Figure 3A:
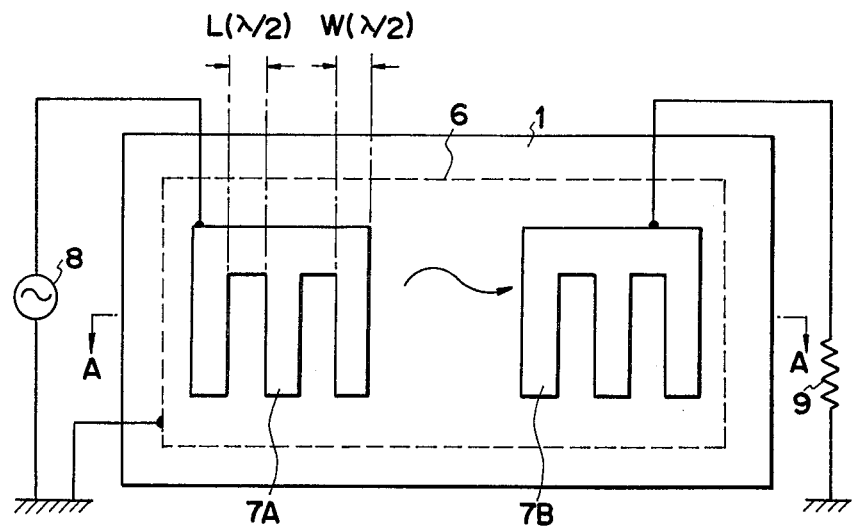
Figure 3B:
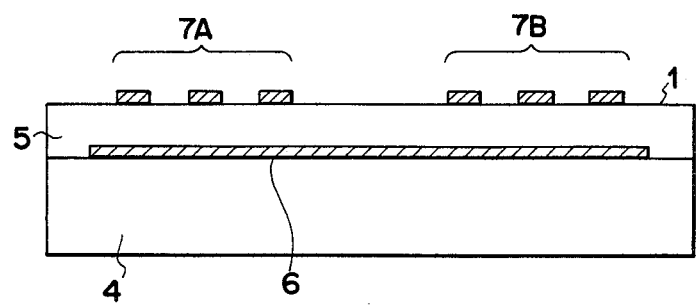
FIG. 3(b) is a sectional view of the conventional surface acoustic wave device of FIG. 3(a)

The invention will now be described in detail by way of a preferred embodiment referring to the drawings.

Figure 5A:
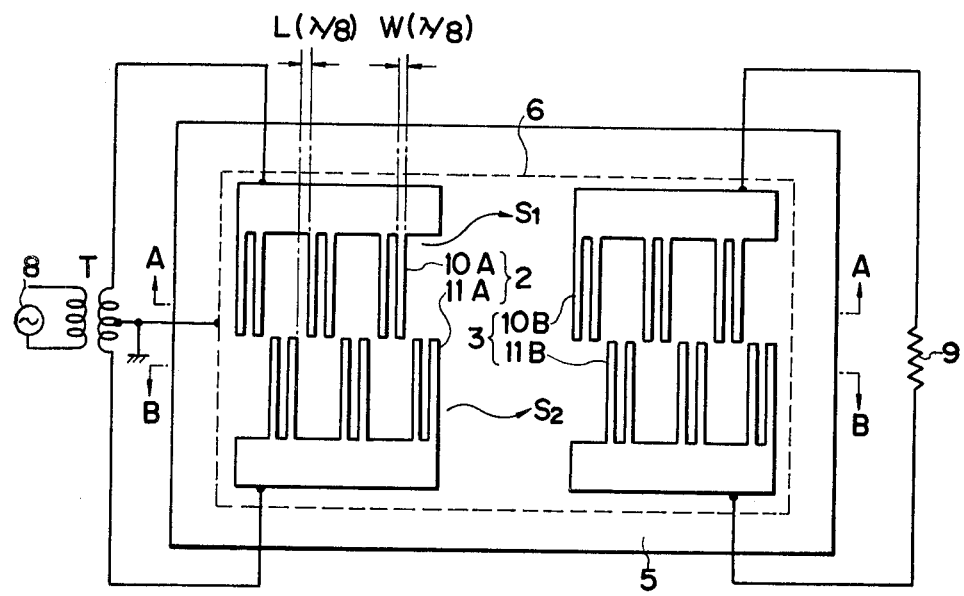
FIG. 5(a) is an upper view showing an embodiment of the surface acoustic wave according to the present invention.
Figure 5B:
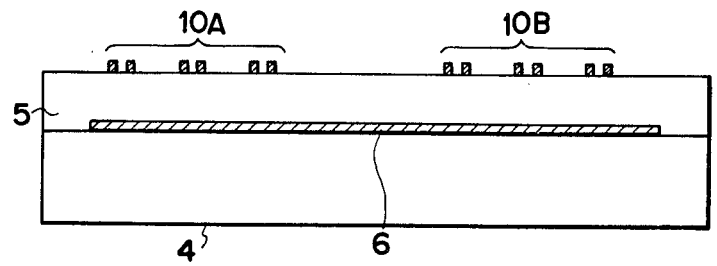
FIGS. 5(b) and 5(c) are sectional views as cut along the A—A' line and the B—B' line of FIG. 5(b), respectively.
Figure 5C:
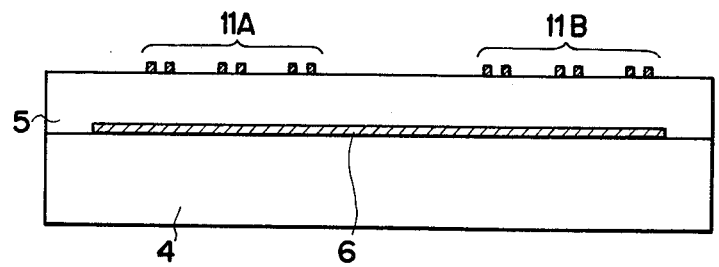

FIGS. 5(a), 5(b) and 5(c) are an upper and sectional views showing an embodiment of the surface acoustic wave device according to the invention. An input transducer 2 and an output transducer 3 each comprise first double electrode 10A or 10B and second double electrode 11A or 11B both disposed in a same plane and opposed to and not interdigitating with each other. Both the first double electrodes 10A and 10B and the second double electrodes 11A and 11B are opposed to a sheet-like lower electrode 6 via a piezoelectric film 5. All the opposed ends of the electrode strips of the double electrodes 10A, 10B, 11A and 11B are aligned, and each electrode strip width W and each distance between the electrode strips are selected to be $\lambda/8$. Reference numeral 9 refers to a load resistance. T denotes a balanced power supply transformer provided for balanced supply of signal voltages from a power source 8 to the double electrodes 10A and 11A of the input transducer 2.

Figure 4:
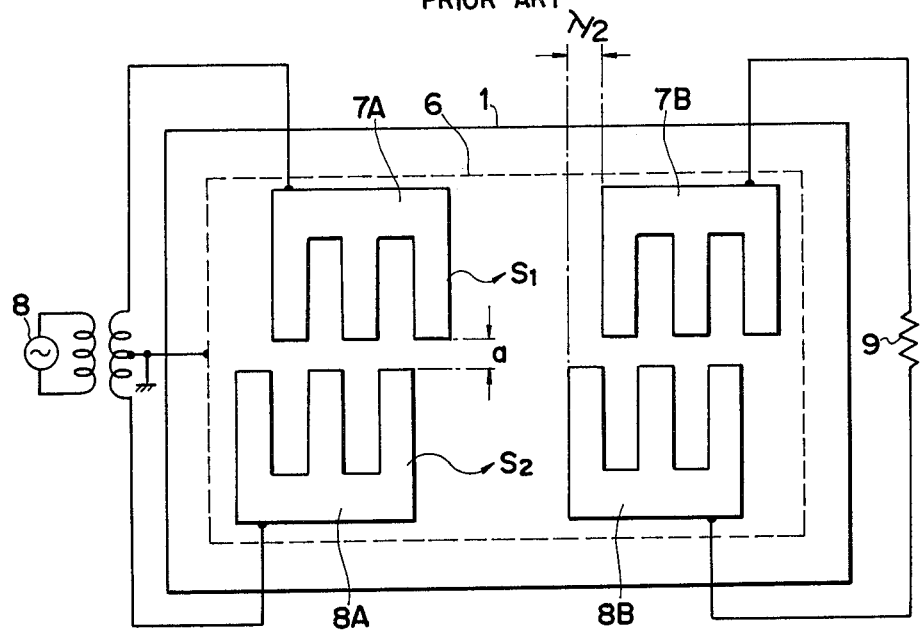
Figure 6:
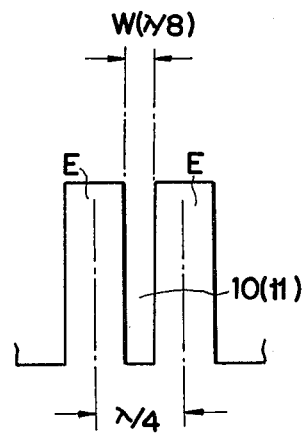
FIG. 6 is an enlarged and partial view of the electrode strips of FIG. 5(a)

With this arrangement, when a signal voltage is applied between the upper electrodes (the first double electrode 10A and the second double electrode 11A) and the lower electrode 6 as shown in FIG. 4 so as to apply an electric field between the upper electrodes 10A, 11A and the lower electrode 6, surface acoustic waves $S_1$ and $S_2$ parallel to each other in the length direction of the transducer are generated by the electrodes 10A and 11A. Since the comb-shaped electrodes which construct the transducers are double electrodes as designated by 10A, 10B, 11A and 11B, undesired influences of mechanical reflection are prevented.

This arrangement maintains the advantages of the above described single phase transducer, i.e. prevention of short circuit and improvement of productivity in manufacturing of the device. Since this arrangement permits application of signal voltages by said balanced power supply system, it is possible to reduce feedthrough and to keep waveforms of surface acoustic waves in order.

If the electrode strip width W is $\lambda/8$ as shown in FIG. 5(a), the distance between the center lines of the adjacent electrode strips E of the double electrodes 10 and 11 is $\lambda/4$. This gives an advantage that influences by mechanical reflection can be prevented even if each electrode strip width and each space between adjacent electrode strips are out of proportion of 1:1. Therefore, a certain amount of inaccuracy of photofabrication of the double electrodes is allowed. This advantage could not be given by the conventional single phase transducers.

Figure 7:
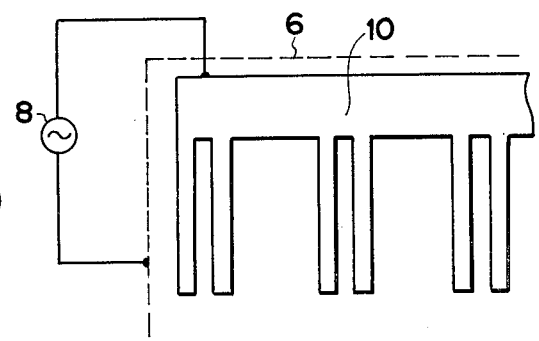
FIG. 7 is a partial view of a modification of the upper electrode.

When feedthrough is not a large problem, the upper electrode need not be of the balanced type, and as shown in FIG. 7, only the first double electrode or the second electrode may be used. This arrangement also effectively prevents influences by mechanical reflection.

The elastic substrate 4 is preferably made of a semiconductive material such as silicon, gallium arsenic (GaAs), SOS (silicon-on-sapphire), etc. in view of production cost and properties of the device. In this case, a low-resistance zone may be formed along the lower surface of the substrate by doping impurities therein to use it as the lower electrode 6. This invention is particularly effective when employed in a surface acoustic wave device for processing high frequency waves. This nature is enforced by making the elastic substrate of sapphire or crystal which have excellent properties.

It is preferable that the piezoelectric film is large in electromechanical coupling coefficient, high in dielectric breakdown voltage, and high in productivity. In this connection, ZnO (zinc oxide) or AlN (aluminum nitride) is recommendable.

As apparent from the description, since the present invention employs the upper electrodes opposed to the lower electrode via the piezoelectric film and comprising the first and/or second double electrodes, it is possible to reduce reflection of surface acoustic waves caused by mechanical reflection, thereby removing all the drawbacks involved in the prior art.

We claim:

1. A surface acoustic wave device which comprises:
    an elastic substrate;
    a lower electrode means provided on said substrate;
    a piezoelectric film deposited so as to cover said lower electrode means; and
    an upper electrode means comprising first and second comb-shaped double electrodes provided on said piezoelectric film and opposed to said lower electrode means, said first and second comb-shaped double electrodes being opposed to and not interdigitating with each other, said double electrodes each having a plurality of split electrode fingers.

2. A surface acoustic wave filter device which comprises:
    an elastic substrate;
    a lower electrode means provided on said substrate;
    a piezoelectric film deposited so as to cover said lower electrode means; and
    an input transducer and an output transducer both provided on said piezoelectric film and opposed to said lower electrode means;

said transducers each comprising first and second comb-shaped double electrodes, and said first and second double electrodes being opposed to and not interdigitating with each other, with fingers of said first double electrode aligned with spaces between fingers of said second double electrode, said double electrodes each having a plurality of split electrode fingers.

3. A device as set forth in claim 1 or claim 2 wherein the split electrode fingers are split into spaced strips, each electrode finger strip width and each distance between adjacent electrode finger strips of said double electrodes are one-eighth of wavelength of a surface acoustic wave which is generated by the double electrodes, respectively, and all the opposed ends of said electrode fingers are aligned along a line transverse to the lengths of the fingers.

4. A device as set forth in claim 2 wherein said input transducer is connected to a signal voltage source by a balanced power supply transformer.

5. A device as set forth in claim 1 or claim 2 wherein said lower electrode means is a low-resistance zone provided along the lower surface of said elastic substrate.

6. A device as set forth in claim 1 or claim 2 wherein said elastic substrate is made of a semiconductive material.

7. A device as set forth in claim 6 wherein said semiconductive material is silicon, gallium arsenic (GaAs) or SOS (silicon-on-sapphire).

8. A device as set forth in claim 1 or claim 2 wherein said piezoelectric film is made of zinc oxide or aluminum nitride.

9. A device as set forth in claim 1 or claim 2 wherein said elastic substrate is made of sapphire or crystal.

10. A surface acoustic wave device which comprises:
an elastic substrate;
a lower electrode means provided on said substrate;
a piezoelectric film deposited so as to cover said lower electrode means; and
an upper electrode means comprising adjacent first and second comb-shaped double electrodes provided on said piezoelectric film and opposed to said lower electrode means beneath said piezoelectric film, said comb-shaped double electrodes each having a plurality of fingers separated by spaces, fingers of said first double electrode extending toward corresponding spaces of said second double electrode, said spaces of said second double electrode being wider than the fingers of said first double electrode, the fingers of said first and second double electrodes having free ends located substantially along a common line transverse to the lengths of the fingers with successive finger free ends spaced apart in the direction of said common line and at least the major length of said fingers of said first double electrode being outside said spaces of said second double electrode.

11. A device as set forth in claim 10 in which said fingers are each split into spaced side-by-side strips, the free ends of said strips being at said common line, connections for a balanced AC power supply of the kind having two ends and a center tap and including a first end connection to the strips of said first double electrode, a center tap connection to said lower electrode underlying the strips of said first and second double electrodes, and a second end connection to the strips of said second double electrode.

* * * * *